United States Patent
Logan et al.

(10) Patent No.: US 12,278,606 B2
(45) Date of Patent: Apr. 15, 2025

(54) EPITAXIAL GROWTH OF ALUMINUM ON ALUMINUM-NITRIDE COMPOUNDS

(71) Applicant: Raytheon Company, Waltham, MA (US)

(72) Inventors: John Andrew Logan, Lawrence, MA (US); Brian Douglas Schultz, Lexington, MA (US); Theodore D. Kennedy, Derry, NH (US)

(73) Assignee: Raytheon Company, Arlington, VA (US)

( * ) Notice: Subject to any disclaimer, the term of this patent is extended or adjusted under 35 U.S.C. 154(b) by 976 days.

(21) Appl. No.: 17/321,031

(22) Filed: May 14, 2021

(65) Prior Publication Data

US 2022/0368302 A1  Nov. 17, 2022

(51) Int. Cl.
*H03H 9/02* (2006.01)
*C23C 14/18* (2006.01)
*C23C 14/28* (2006.01)
*C30B 23/02* (2006.01)
*C30B 29/02* (2006.01)
(Continued)

(52) U.S. Cl.
CPC ............ *H03H 3/02* (2013.01); *C23C 14/18* (2013.01); *C23C 14/28* (2013.01); *C30B 23/025* (2013.01); *C30B 29/02* (2013.01); *H03H 9/02031* (2013.01); *H03H 9/13* (2013.01); *H03H 9/174* (2013.01); *H03H 9/176* (2013.01); *H03H 2003/023* (2013.01)

(58) Field of Classification Search
CPC ......... H03H 9/0203; H03H 9/13; H03H 9/176
See application file for complete search history.

(56) References Cited

U.S. PATENT DOCUMENTS

2004/0261689 A1  12/2004  Tsong et al.
2016/0153119 A1  6/2016  Du et al.
(Continued)

FOREIGN PATENT DOCUMENTS

CN  1140931 C  3/2004
CN  105047775 A  11/2015
(Continued)

OTHER PUBLICATIONS

International Search Report and Written Opinion received for corresponding PCT Application No. PCT/US2022/028836 dated Aug. 19, 2022, pp. 16.
(Continued)

*Primary Examiner* — Derek J Rosenau
(74) *Attorney, Agent, or Firm* — Kinney & Lange, P.A.

(57) ABSTRACT

Apparatus and associated methods relate to forming an epitaxial layer of aluminum on an aluminum-nitride compound. The aluminum is epitaxially grown on the crystalline aluminum-nitride compound by maintaining temperature of a crystalline aluminum-nitride compound below a cluster-favoring temperature threshold within a vacuum chamber. Then, the crystalline aluminum-nitride compound is exposed to atoms of elemental aluminum for a predetermined time duration. The aluminum is epitaxially grown in this fashion for a predetermined time duration so as to produce a layer of epitaxial aluminum of a predetermined thickness. Such epitaxially-grown mono-crystalline aluminum has a lower resistivity than poly-crystalline aluminum.

12 Claims, 6 Drawing Sheets

(51) Int. Cl.
*H03H 3/02* (2006.01)
*H03H 9/13* (2006.01)
*H03H 9/17* (2006.01)

(56) References Cited

U.S. PATENT DOCUMENTS

2017/0141750 A1    5/2017    Pelzel et al.
2020/0389150 A1*  12/2020    Wang .................... H03H 9/174

FOREIGN PATENT DOCUMENTS

| CN | 105703732 A | 6/2016 |
| CN | 109037371 A | 12/2018 |
| JP | 2007081645 A | 3/2007 |
| JP | 2019501570 A | 1/2019 |

OTHER PUBLICATIONS

Tournet J et al: "Growth and characterization of epitaxial aluminum layers on gallium-arsenide substrates for superconducting quantum bits", Superconductor Science and Technology, vol. 29, No. 6, Apr. 2016, p. 64004, XP020304239.
Tsai Yi-Hsun et al: "Nano-to atomic-scale epitaxial aluminum films on Si substrate grown by molecular beam epitaxy", AIP Advances, vol. 9, No. 10, 105001, Oct. 2019, pp. 1-5, XP01224 I005.
Akiyama Morito et al: "Influence of growth temperature and scandium concentration on piezoelectric response of scandium aluminum nitride alloy thin films", Applied Physics Letters, vol. 95, No. 16, Oct. 2009, pp. 162107.:162107, XP012126144.
International Preliminary Report of Patentability dated Nov. 14, 2023, received for corresponding PCT Application No. PCT/US2022/028836.
Japanese Office Action mailed Sep. 24, 2024, for corresponding Japanese Patent Application No. 2023-569831, 8 pgs.
Decision of Refusal mailed on Jan. 7, 2025, for corresponding Japanese Patent Application No. 2023-569831, 7 pgs.
Korean Office Action date Dec. 18, 2024, for corresponding Korean Patent Application No. 10-2023-7041509, 6 pgs.

* cited by examiner

EPITAXIAL GROWTH OF ALUMINUM ON ALUMINUM-NITRIDE COMPOUNDS

BACKGROUND

Bulk Acoustic Wave (BAW) resonators are used for high-frequency filtering of signals. Various structures and materials are used to manufacture BAW resonators. These structures generally are formed of a thin layer of piezoelectric material sandwiched between two electrically conductive contacts. These structures are then acoustically isolated from the surrounding medium, such as, for example, any substrates. The impedance/frequency relation of such BAW resonators can have sharp resonance features. Such impedance resonances can provide precise frequency selection for filtering electrical signals. These resonant features, however, are dependent upon various metrics of the specific BAW resonator structures, such as, for example, piezo-electric material, contact material, and thicknesses of each of the layers. Thinner contact layers advantageously facilitate better control and performance of these BAW resonator structures.

SUMMARY

Apparatus and associated methods relate to forming an epitaxial layer of aluminum on a mono-crystalline aluminum-nitride compound layer. A method for doing such includes loading a wafer having a mono-crystalline aluminum-nitride compound layer into a vacuum chamber in which both temperature and atmosphere are controlled. The method further includes maintaining temperature of the wafer below a cluster-favoring temperature threshold. The method also includes exposing the wafer to atoms of elemental aluminum for a predetermined time duration within the vacuum chamber.

Some embodiments relate to a Bulk Acoustic Wave (BAW) resonator structure. The BAW resonator structure includes a mono-crystalline aluminum-nitride-compound layer. The BAW resonator structure further includes a first contact layer coupled to a first face of the mono-crystalline aluminum-nitride-compound layer, the first contact layer being a monocrystalline aluminum contact layer crystallographically coupled to the mono-crystalline aluminum-nitride-compound layer. The BAW resonator structure also includes a second contact layer coupled to a second face of the mono-crystalline aluminum-nitride-compound layer.

DETAILED DESCRIPTION

Apparatus and associated methods relate to forming an epitaxial layer of aluminum on an aluminum-nitride compound. The aluminum is epitaxially grown on the mono-crystalline aluminum-nitride compound by maintaining temperature of a mono-crystalline aluminum-nitride compound below a cluster-favoring temperature threshold within a vacuum chamber. Then, the mono-crystalline aluminum-nitride compound is exposed to atoms of elemental aluminum for a predetermined time duration. The aluminum is epitaxially grown in this fashion for a predetermined time duration so as to produce a layer of epitaxial aluminum of a predetermined thickness. Such epitaxially-grown mono-crystalline (i.e., single-crystalline) aluminum has a lower resistivity than poly-crystalline aluminum. Because the resistivity of epitaxially grown aluminum is lower than that of poly-crystalline aluminum, a mono-crystalline aluminum contact layer can be thinner than a poly-crystalline contact layer of equal resistance. Such a thin contact layer can facilitate better control and performance of a Bulk Acoustic Wave (BAW) resonator structure.

Figure 1:
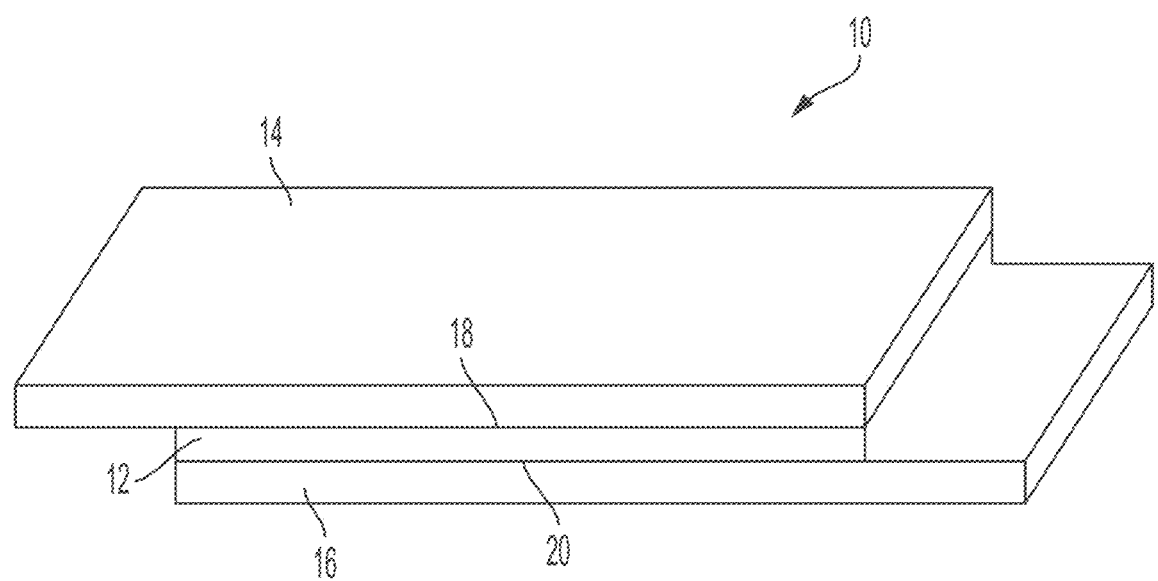
FIG. 1 is a cross-sectional diagram of a Bulk Acoustic Wave (BAW) resonator structure, in which epitaxially grown aluminum is grown on an aluminum-nitride compound in a vacuum chamber.

FIG. 1 is cross-sectional diagram of a Bulk Acoustic Wave (BAW) resonator structure, in which epitaxially grown aluminum is grown on a piezoelectric aluminum-nitride compound in a vacuum chamber. The use of a vacuum chamber facilitates high-quality epitaxial growth of aluminum because unintended oxidation of such an aluminum layer is inhibited thereby. In FIG. 1, BAW resonator structure 10 includes mono-crystalline aluminum-nitride-compound layer 12 sandwiched between first and second contact layers 14 and 16. Various types of aluminum-nitride compounds can be used in aluminum-nitride-compound layer 12. For example, scandium-aluminum-nitrides ($Sc_xAl_{1-x}N$) or yttrium-aluminum-nitrides ($Y_xAl_{1-x}N$) can be used in aluminum-nitride-compound layer 12. The subscript x used in the $Sc_xAl_{1-x}N$ formula can be between 0 and 0.50, between 0.15 and 0.45, or between 0.40 and 0.43, for example. Here, the piezoelectric response changes in response to changes in the relative-composition index x as is known in the art (see, e.g., Akiyama et al. Appl. Phys. Lett. 95 162107 (2009).

First contact layer 14 is a layer of mono-crystalline aluminum crystallographically coupled to first face 18 of mono-crystalline aluminum-nitride-compound layer 12.

Crystallographically coupling of first contact layer 14 to mono-crystalline aluminum-nitride-compound layer 12 results from epitaxial growth on the mono-crystalline aluminum material of first contact layer 14 upon the crystallographic structure of mono-crystalline aluminum-nitride-compound layer 12. Such epitaxial growth of one material upon a mono-crystalline material results in the grown material assuming lateral lattice dimensions that are commensurate (e.g., related) with those of the underlying mono-crystalline material. Similarly, such epitaxial growth also results in a crystallographic relationship between the grown material and the mono-crystalline surface material of the substrate.

Second contact layer 16 is coupled to second face 20 of mono-crystalline aluminum-nitride-compound layer 12. In some embodiments, second contact layer 16 is poly-crystalline aluminum, but in other embodiments, second contact layer 16 is mono-crystalline aluminum. In these latter embodiments, aluminum for both first and second contact layers 14 and 16 can be epitaxially grown upon mono-crystalline aluminum-nitride-compound layer 12. While in principle, first contact layer 14, aluminum-nitride-compound layer 12, and second contact layer 16 could all be grown consecutively, in practice, first and/or second contact layers 14 and 16 are typically grown at separate times. In such cases, before second contact layer 16 is created, a processing etch step could be performed to remove some/all of any substrate material below aluminum-nitride-compound layer 12 so as to permit epitaxial growth upon an exposed surface of mono-crystalline aluminum-nitride-compound layer 12. As will be shown below, epitaxially-grown aluminum contact layers can have a lower bulk resistivity than traditionally deposited poly-crystalline aluminum contact layers.

Figure 2:
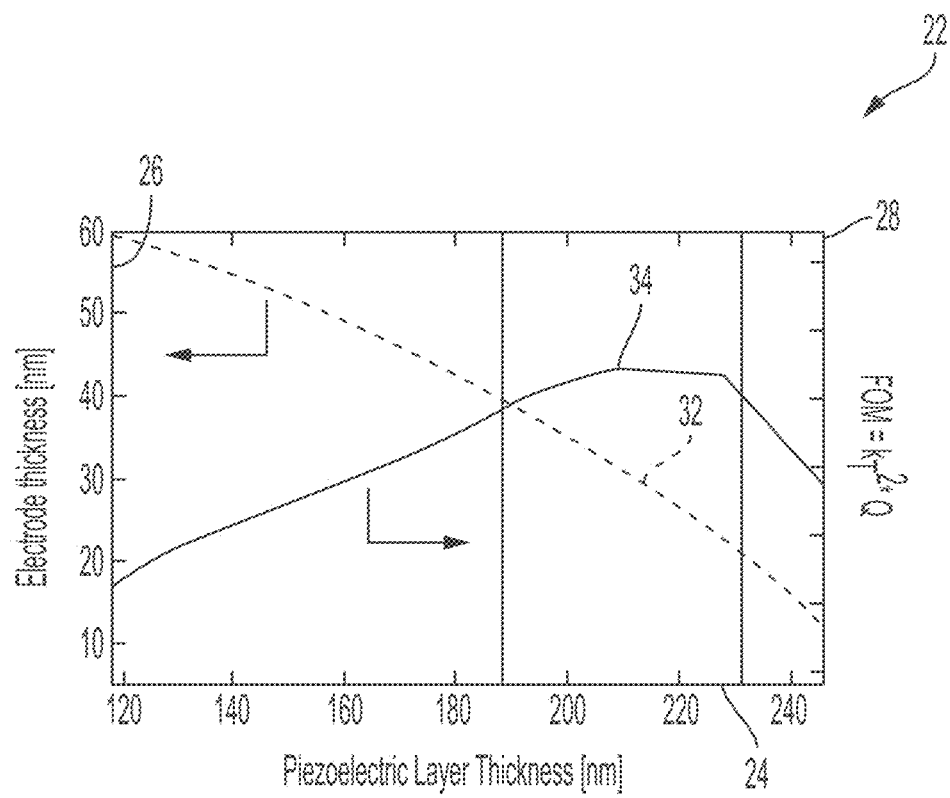
FIG. 2 is a graph of simulated Figure of Merit (FOM) for a BAW resonator verses thickness of the piezoelectric aluminum-nitride-compound layer.

FIG. 2 is a graph of simulated Figure of Merit (FOM) for a BAW resonator verses thickness of the piezoelectric aluminum-nitride-compound layer. In FIG. 2, graph 22 has horizontal axis 24, first vertical axis 26, second vertical axis 28, contact-thickness/resonator-thickness relation 32, and Figure-Of-Merit-(FOM)/resonator-thickness relation 34. Horizontal axis 24 is indicative of thickness of a piezoelectric aluminum-nitride-compound layer 12 (as depicted in FIG. 1), as measured between inside surfaces of first and second contact layers 14 and 16. First vertical axis 26 is indicative of thickness of the aluminum of each of first and second contact layers 14 and 16, which has been grown/deposited upon mono-crystalline aluminum-nitride-compound layer 12. Contact-thickness/resonator-thickness relation 32 depicts the relation between thickness of each of first and second contact layers 14 and 16 and thickness of aluminum-nitride-compound layer 12. As indicated by contact-thickness/resonator-thickness relation 32, as the thickness of the contact layers is reduced, the thickness of the aluminum-nitride-compound layer can be increased for a given center frequency.

Second vertical axis 26 is indicative of a Figure Of Merit (FOM) as calculated by:

$$\text{FOM} = k_T^2 \cdot Q \quad (1)$$

Here, $k_T$ is the electromechanical coupling coefficient of the piezoelectric material and Q is the quality factor of BAW resonator structure 10. Simulated Figure-Of-Merit-(FOM)/resonator-thickness relation 34 depicts the relation between this FOM as calculated using equation (1) and total thickness of aluminum-nitride-compound layer 12. As indicated by simulated FOM/aluminum-nitride-compound thickness relation 34, for an AlN resonator with aluminum electrodes for a given center frequency, the simulated FOM peaks for total aluminum-nitride-compound thickness between 190 nm and 230 nm, which corresponds to contact-layer thicknesses between 20 nm and 40 nm.

Figure 3:
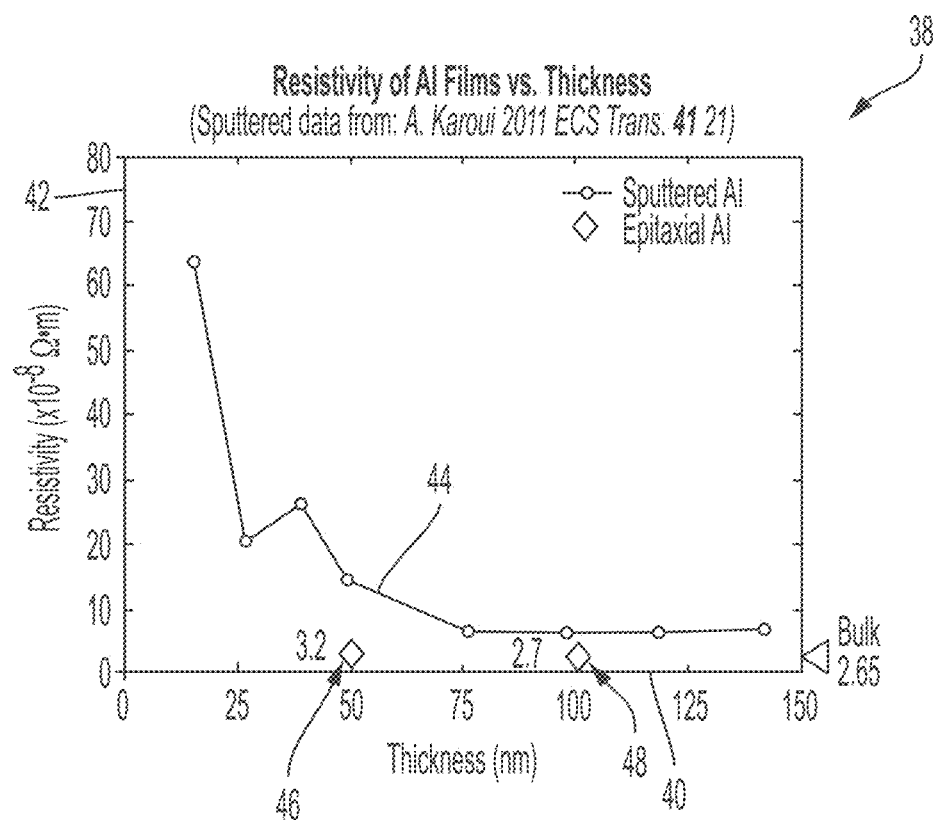
FIG. 3 is a graph of resistivity of aluminum versus thickness for both sputter-deposited aluminum and epitaxially-grown aluminum.

FIG. 3 is a graph of resistivity of aluminum versus thickness for both sputter-deposited aluminum and epitaxially-grown aluminum. In FIG. 3, graph 38 includes horizontal axis 40, vertical axis 42, electrical-resistivity/thickness relation 44 and electrical-resistivity/thickness data 46 and 48. Horizontal axis 40 is indicative of thickness of first contact layer 14 (as depicted in FIG. 1). Vertical axis 42 is indicative of resistivity of first contact layer 14. Electrical-resistivity/thickness relation 44 depicts the relation between electrical resistivity (e.g., as measured in Ohms-meter) and thickness (e.g., as measured in nm) of a sputter-deposited layer of poly-crystalline aluminum (data from A. Karoui 2011 ECS Trans. 41 21). As indicated in electrical-resistivity/thickness relation 44, the electrical resistivity is approximately inversely related to thickness of a sputter-deposited layer of poly-crystalline aluminum. Electrical-resistivity/thickness data 46 and 48 are data points that depict the relation between electrical resistivity and thickness of an epitaxially-grown layer of mono-crystalline aluminum used for first contact layer 14. As indicated in FIG. 3, the epitaxially-grown mono-crystalline aluminum has much lower electrical resistivity than the sputter-deposited poly-crystalline aluminum. Such a lower electrical resistivity can permit a thinner first contact layer to be used without compromising on a resulting sheet resistance. Conversely the same thickness can be used for the first contact layer, with the epitaxially-grown mono-crystalline aluminum exhibiting much decreased sheet resistance. Note that the resulting resistivity of the mono-crystalline aluminum used for first contact layer 14 is near that of a bulk resistivity of aluminum ($\sim 2.65 \times 10^{-8}$ $\Omega \cdot$m). In some examples, the resistivity of the mono-crystalline aluminum used for first contact layer 14 can be less than 150%, 135%, 120%, or 110% of bulk resistivity of aluminum.

Figures 4A, 4B:
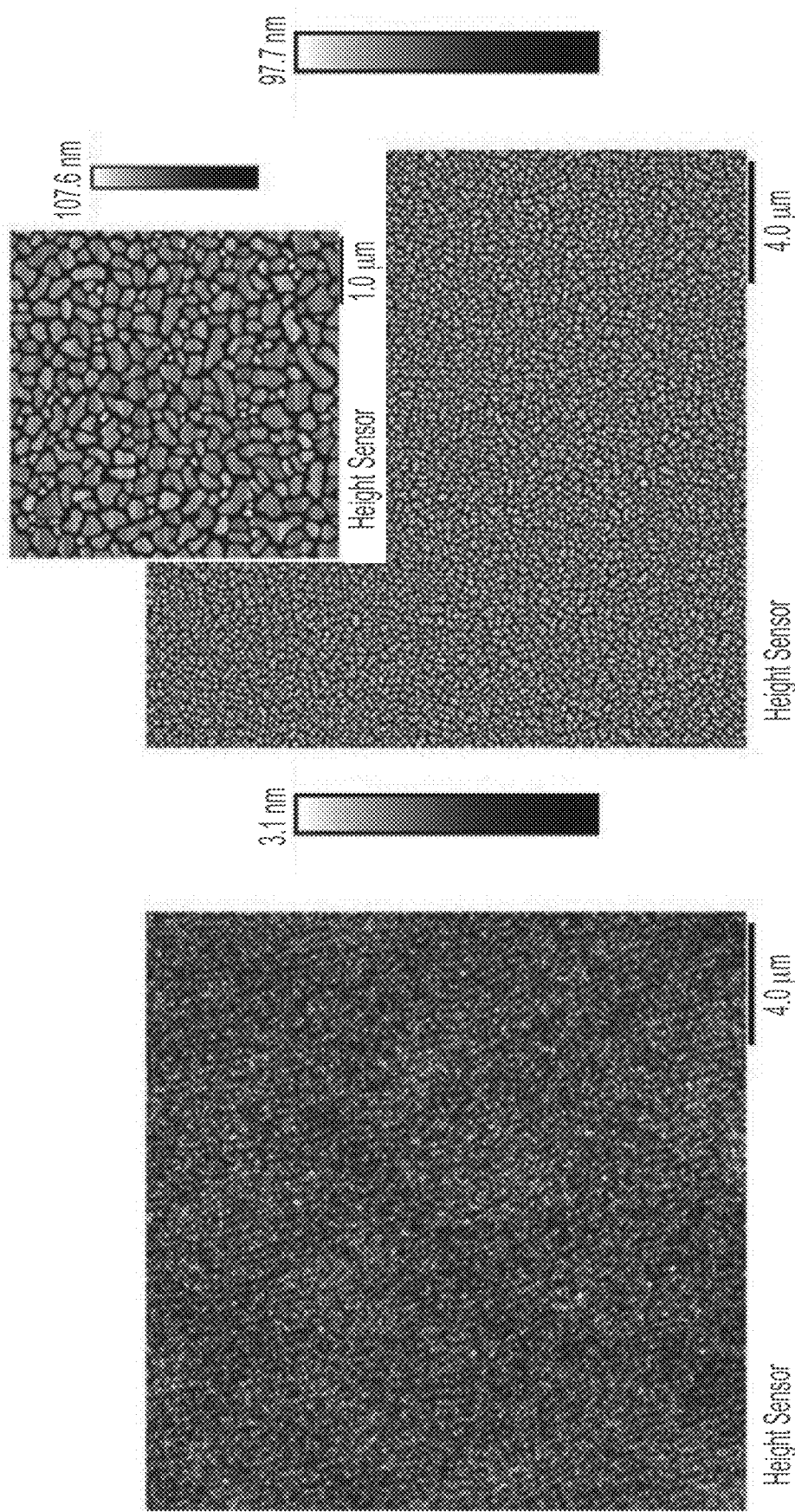
FIGS. 4A-B are plan view depictions of surfaces of aluminum deposited at below room temperature and at room temperature, respectively.

FIGS. 4A-B are plan view depictions of surfaces of aluminum deposited at below room temperature and at room temperature, respectively. FIG. 4A depicts an atomic force microscopy (AFM) image of a surface of first contact layer 14 (as depicted in FIG. 1), for aluminum epitaxially grown at a temperature below room temperature. The FIG. 4A depiction shows a microscopically smooth surface without any indication of aluminum clusters. X-ray diffraction studies have confirmed that such below-room-temperature epitaxially-grown aluminum is indeed mono-crystalline. FIG. 4B depicts an image of a surface of first contact layer 14 (as depicted in FIG. 1), for aluminum epitaxially grown at room temperature. The FIG. 4B depiction (and the enlargement depicted in the inset above FIG. 4B) shows cluster formation, which can be indicative of poly-crystalline aluminum formation (with higher electrical resistivity) or electrical discontinuity between clusters. The surface mobility of aluminum is high, even at room temperature. Therefore, at room temperature, aluminum adatoms tend to cluster with one another before they find a favorable site, at which to form a crystallographic bond with the underlying material. Thus, room temperature is a cluster favorable temperature. There exists a cluster-favoring threshold temperature above which the aluminum adatoms favor cluster formation over crystallographic bonding, and below which aluminum adatoms favor crystallographic bonding over cluster formation. Because room temperature is above such a cluster-favoring temperature threshold, attempts to epitaxially grow aluminum on aluminum-nitride compounds typically result in poly-crystalline aluminum deposition and not mono-crystalline aluminum formation. Conversely, below the cluster-favoring temperature threshold, attempts to epitaxially grow aluminum on aluminum-nitride compounds can be successful.

Figure 5:
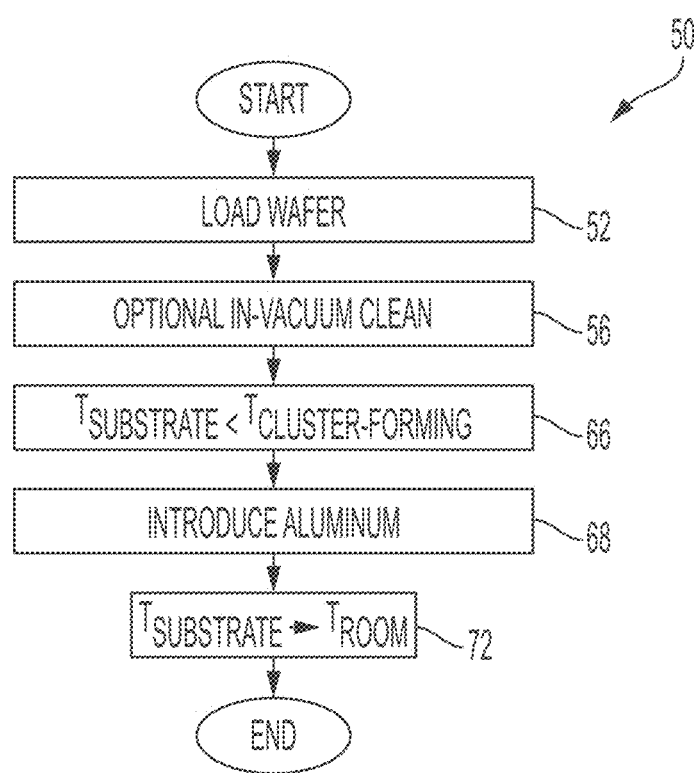
FIG. 5 is a flowchart of a method for epitaxially growing aluminum on an aluminum-nitride compound.

FIG. 5 is a flowchart of a method for epitaxially growing mono-crystalline aluminum on an aluminum-nitride compound. In FIG. 5, the depicted flowchart describes method 50 for forming an epitaxial layer of aluminum on an aluminum-nitride compound. Method 50 begins at step 52 where a wafer having a mono-crystalline surface of an aluminum-nitride compound is loaded into a vacuum chamber for molecular beam epitaxy. Then, at step 56, the wafer can be optionally cleaned in-vacuum via various techniques known in the art such as thermal outgassing, plasma cleaning, gallium flash cleaning, or other approach. At step 66, the temperature of the substrate is reduced to below the cluster-forming temperature threshold. Various methods of cooling the wafer can be performed at step 66. When the temperature of the substrate has been reduced to a temperature below the cluster-forming temperature threshold, then the method proceeds to step 68, where elemental aluminum is introduced into the chamber (e.g., via an effusion cell). At step 68, aluminum is epitaxially grown upon the mono-crystalline surface of aluminum-nitride compound. The method remains at step 68 until the epitaxially-grown aluminum layer reaches a predetermined thickness. At step 72 the temperature of the substrate is increased to room temperature. Finally, at step 74, the wafer is removed from the chamber and method 50 ends.

Figure 6A:
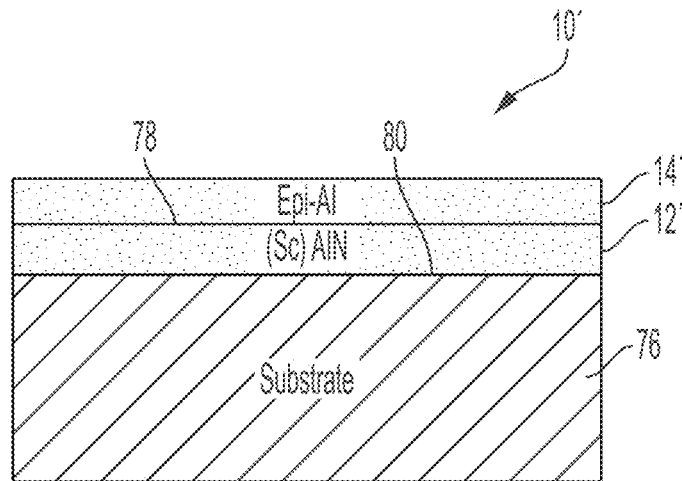
FIGS. 6A-6B are cross-sectional diagrams of an embodiment of a BAW resonator structure at various stages of manufacture.
Figure 6B:
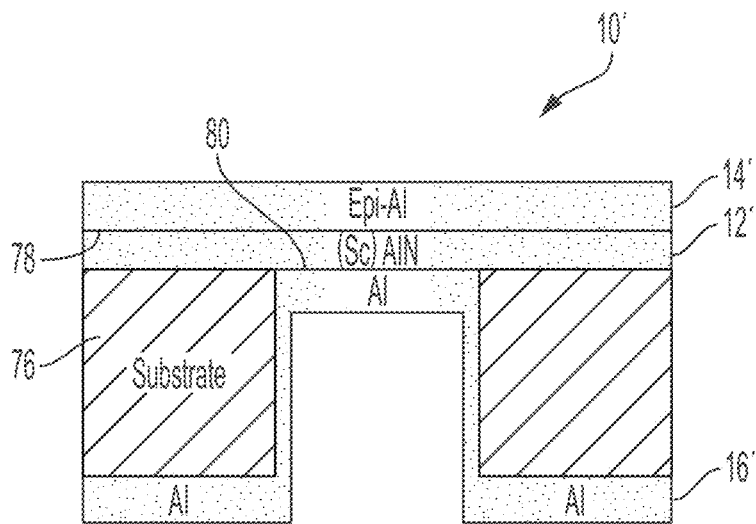

FIGS. 6A-6B are cross-sectional diagrams of an embodiment of a BAW resonator structure at various stages of manufacture. In FIG. 6A, BAW resonator structure 10' is being formed on substrate 76 having mono-crystalline surface 78 of mono-crystalline aluminum-nitride-compound layer 12'. Upon mono-crystalline surface 78 is first contact layer 14', consisting of a mono-crystalline aluminum layer. Subsequently, in FIG. 6B, the lower surface of substrate 76 has been partially removed, such as through mechanical or chemical etching, so as to provide access to lower mono-crystalline surface 80. Then, second contact layer 16' is formed on the lower mono-crystalline surface 80, either with poly-crystalline or mono-crystalline aluminum. In such a manner, for example, the sandwich structure of BAW resonator structure 10' can be formed in a particular region of substrate 76.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A Bulk Acoustic Wave (BAW) resonator structure comprising:
   a mono-crystalline aluminum-nitride-compound layer;
   a first contact layer coupled to a first face of the mono-crystalline aluminum-nitride-compound layer, the first contact layer being a mono-crystalline aluminum contact layer crystallographically coupled to the mono-crystalline aluminum-nitride-compound layer; and
   a second contact layer coupled to a second face of the mono-crystalline aluminum-nitride-compound layer, wherein the wherein the second contact is a poly-crystalline aluminum layer.

2. The BAW resonator structure of claim 1, wherein the first contact layer has a thickness less than a critical thickness limit.

3. The BAW resonator structure of claim 1, wherein the first contact layer has a thickness less than 40 nm.

4. The BAW resonator structure of claim 1, wherein the first contact layer has a thickness less than 30 nm.

5. The BAW resonator structure of claim 1, wherein the aluminum-nitride-compound layer comprises scandium$_{(x)}$-aluminum$_{(1-x)}$-nitride ($Sc_xAl_{1-x}N$).

6. The BAW resonator structure of claim 5, wherein x is between 0.00 and 0.50.

7. The BAW resonator structure of claim 6, wherein x is between 0.15 and 0.45.

8. The BAW resonator structure of claim 7, wherein x is between 0.40 and 0.43.

9. The BAW resonator structure of claim 1, wherein a second thickness of the second contact is greater than a first thickness of the first contact.

10. The BAW resonator structure of claim 1, wherein the mono-crystalline aluminum-nitride-compound layer is a piezoelectric layer.

11. The BAW resonator structure of claim 1, wherein the resistivity of the first contact layer is less than 150% of a bulk resistivity of aluminum.

12. The BAW resonator structure of claim 1, wherein the resistivity of the first contact layer is less than 135% of a bulk resistivity of aluminum.

* * * * *